United States Patent [19]

Gaalema

[11] Patent Number: 4,507,674
[45] Date of Patent: Mar. 26, 1985

[54] BACKSIDE ILLUMINATED BLOCKED IMPURITY BAND INFRARED DETECTOR

[75] Inventor: Stephen D. Gaalema, Carlsbad, Calif.

[73] Assignee: Hughes Aircraft Company, Culver City, Calif.

[21] Appl. No.: 385,979

[22] Filed: Jun. 7, 1982

[51] Int. Cl.³ .............................................. H01L 27/14
[52] U.S. Cl. .......................................... 357/30; 357/32
[58] Field of Search ........................... 357/30, 30 H, 32

[56] References Cited

U.S. PATENT DOCUMENTS

| | | | |
|---|---|---|---|
| 3,959,646 | 5/1976 | De Cremoux | 357/30 X |
| 3,961,997 | 6/1976 | Chu | 357/30 X |
| 4,028,719 | 6/1977 | Curtis | 357/30 |
| 4,122,407 | 10/1978 | Van Vechten | 357/30 X |
| 4,198,647 | 4/1980 | Grinberg et al. | 357/30 |
| 4,228,365 | 10/1980 | Gutierrez et al. | 357/30 X |
| 4,231,050 | 10/1980 | Casey, Jr. et al. | 357/30 X |
| 4,242,695 | 12/1980 | Ouchi et al. | 357/30 |
| 4,383,267 | 5/1983 | Webb | 357/30 |

Primary Examiner—Andrew J. James
Assistant Examiner—William A. Mintel
Attorney, Agent, or Firm—William J. Bethurum

[57] ABSTRACT

A rear illuminated radiation detector comprising a rear contact adjacent to a substrate substantially transparent to incident radiation of a given frequency range, detector and blocking layers overlying said rear contact, and a front contact overlying the detector and blocking layers. The layers are disposed so that, through them, the front contact is in electrical contact with the rear contact. Radiation may enter the detector layer from the rear, through the substrate, thereby permitting the detector to be operated in a backside illuminated mode. Such detectors may be fabricated in highly dense arrays and coupled to either hybrid or monolithic readout structures as required for operation as a focal plane array radiation detector. Optionally, the front contact may be left exposed so that radiation may enter the detector layer from the front of the radiation detector, thereby permitting it to be operated in both backside and frontside illuminated modes.

3 Claims, 4 Drawing Figures

BACKSIDE ILLUMINATED BLOCKED IMPURITY BAND INFRARED DETECTOR

BACKGROUND

The present invention relates generally to radiation detectors and, more specifically, to enhanced sensitivity backside illuminated radiation detectors particularly adaptable for the detection of long wave infrared radiation (LWIR).

Naturally, in the design and construction of high quality radiation detectors, the desire is to make the detector as sensitive as possible to incident radiation within a desired range of frequencies. A generally well known cause of limited sensitivity is a generic phenomenon known as dark current. This phenomenon encompasses a number of different mechanisms operating simultaneously, though perhaps independently, within the radiation detector. These mechanisms, however, are similar in that they result in the flow of current through the detector irrespective of whether there is incident radiation. Thus, the flow of current in the absence of meaningful illumination gives rise to the generic term dark current.

Detector sensitivity is lost in direct proportion to the amount of dark current that flows through the detector. Since dark current effectively generates noise in proportion to its current density, significant dark current flow directly results in the reduction of the detector's signal to noise ratio. Thus, the substantial, if not complete, inhibition of any of the constituent dark current mechanisms will yield a distinct improvement in the sensitivity of the radiation detector.

As an example, a generally known dark current mechanism is thermal charge carrier generation. In the case of a donor impurity type radiation detector, electrons are ionized from their associated impurity atoms by the absorption of thermal energy. These ionized electrons move from the impurity level to the conduction band of the crystal lattice. They are then swept by an electric field to the positive radiation detector electrical contact. The electric field, of course, is created by a voltage potential difference applied across the radiation detector. Additional electrons are injected from the negative potential electrical contact. The net effect, therefore, is a dark current flowing through the radiation detector independently of any current induced by incident radiation.

A method of substantially inhibiting dark current due to the thermal generation mechanism is equally well known. Since thermal energy is required for the mechanism to operate, reducing the temperature of the radiation detector to within a few degrees of absolute zero effectively freezes out the mechanism. Accordingly, the percentage of impurity band electrons in the conduction band due to radiation absorption ionization is increased, resulting in a greater detector sensitivity to incident radiation.

Another known dark current mechanism is gamma radiation induced charge carrier generation. Radiation detectors are naturally designed and constructed so as to be as insensitive as possible to incident radiation of all such frequencies that fall outside their particularly desired frequency detection range. However, some percentage of incident radiation of any given frequency will be absorbed by a practical radiation detector. Due to the high energy of charge carriers generated by gamma radiation absorbtion, additional charge carriers are subsequently generated through electron collisions. This charge carrier multiplication results in a substantial dark current. Consequently, gamma generated dark current is of particular concern in the case of radiation detectors intended for operation in environments subject to significant amounts of gamma radiation.

This particular sensitivity to gamma radiation is heightened in the case of most conventional radiation detectors. Typically, they utilize high volume, low doping density radiation detection regions for the absorbtion of incident radiation. The low doping density provides for a low conductivity detection region as needed to inhibit the ordinary flow of current from the applied bias voltage potential through the impurity band of the detection region. The high volume of the detection region compensates for the low doping density as necessary to maintain an acceptable radiation absorbtion efficiency. This, however, increases the sensitivity of the detector to gamma radiation. The high volume of the detection region affords gamma radiation a greater statistical opportunity to be absorbed. Consequently, most conventional radiation detectors operate inaccurately, if at all, in the presence of significant quantities of gamma radiation.

As mentioned above, there are a wide variety of mechanisms that result in the generation of dark current. Some of these mechanisms are fairly well understood and methods of inhibiting their operation have been devised. Others, including the impurity band conduction mechanism, are less well understood, if at all.

It is also desirable, with regard to the design and construction of high quality radiation detectors, that they be particularly adaptable to a wide variety of applications. These applications may range from the simple detection of a given radiation wavelength to the high resolution imaging of complex radiation sources. Thus, the radiation detector must be adaptable for use as a discrete device as well as in high density focal plane arrays (FPA). Further, with regard to its use in FPA's, the radiation detector must be compatible with a wide variety of read-out structures, including hybridized thin film circuitry and monolithic charge coupled device (CCD) circuitry. The use of a hybrid readout structure in conjunction with an FPA generally requires that the radiation detector be capable of operation in a reverse or backside illuminated mode.

SUMMARY OF THE INVENTION

It is, therefore, the general purpose of the present invention to provide a radiation detector that exhibits an enhanced and particular sensitivity to incident radiation of a desired frequency range, and that is easily adaptable to a wide variety of applications.

This is accomplished by providing a rear detector contact adjacent to the surface of a substrate that is substantially transparent to radiation of a given frequency range, a detector and an impurity band conduction blocking layer overlying the rear detector contact, and a front detector contact overlying the detector and blocking layers. The front detector contact is further provided so as to be in electrical contact with the rear detector through a radiation detection region of the detector layer. This allows the sensing of charge carrier generation due to radiation absorbtion ionization.

Consequently, an advantage of the present invention is that it possesses a particular and enhanced sensitivity to incident radiation within its desired frequency range due to a significant reduction in the radiation detector dark current flow. The detector sensitivity is optimized through the use of a low volume detection region, relative to conventional detectors, that increases its insensitivity to gamma frequency radiation. The sensitivity to radiation within the desired frequency range is enhanced by the substantial inhibition of detection region impurity band conduction through the use of a blocking layer. This particular and enhanced sensivity may be displayed over an extended operating cycle bandwidth due to a decreased detector response time to chopped or pulsed incident radiation.

Another advantage of the present invention is that it is adaptable to receiving incident radiation in either a backside illuminated or a frontside illuminated mode, or both.

A further advantage of the present invention is that it requires only a simple fabrication procedure, utilizing conventional, well known fabrication steps, in order to produce a radiation detector.

Still another advantage of the present invention is that a plurality of radiation detectors may be fabricated on a common substrate for later packaging, separately, as discrete devices or, without division, as a monolithic substrate radiation detector focal plane array.

A still further advantage of the present invention is that very dense radiation detector focal plane arrays may be easily fabricated. The structure of the radiation detectors permits the front detector contacts to be electrically isolated from one another without need for additional fabrication steps or the introduction of electrical isolation structural features. Further, a single metal contact may be used in common by a number of radiation detectors to provide electrical contact to their respective rear detector contacts, thereby optimizing the use of the front radiation detector surface. Similarly, use of the radiation detector in its backside illuminated mode also optimizes the use of the front radiation detector surface by eliminating the need for frontside radiation transparent windows.

Yet another advantage of the present invention is that it is easily adaptable for use in radiation detector arrays utilizing either the monolithic CCD or hybrid read-out structures that are characteristically used in focal plane array applications.

BRIEF DESCRIPTION OF THE DRAWINGS

Other attendant advantages of the present invention will become apparent and readily appreciated as the same becomes better understood by reference to the following detailed description when considered in connection with the accompanying drawings in which like reference numerals designate like parts throughout the figures and wherein.

DETAILED DESCRIPTION OF THE INVENTION

Radiation detectors constructed according to the present invention may be optimized for a wide variety of applications. In order to facilitate the description of the invention and the understanding of its operation, the radiation detector constructed and optimized for use in the present invention's originally intended mode of operation will be described below. A number of the contemplated variations of the present invention are described thereafter. The descriptions of these embodiments are illustrative of the present invention and provide a basis for the claims which define the scope of the present invention.

Figure 1:
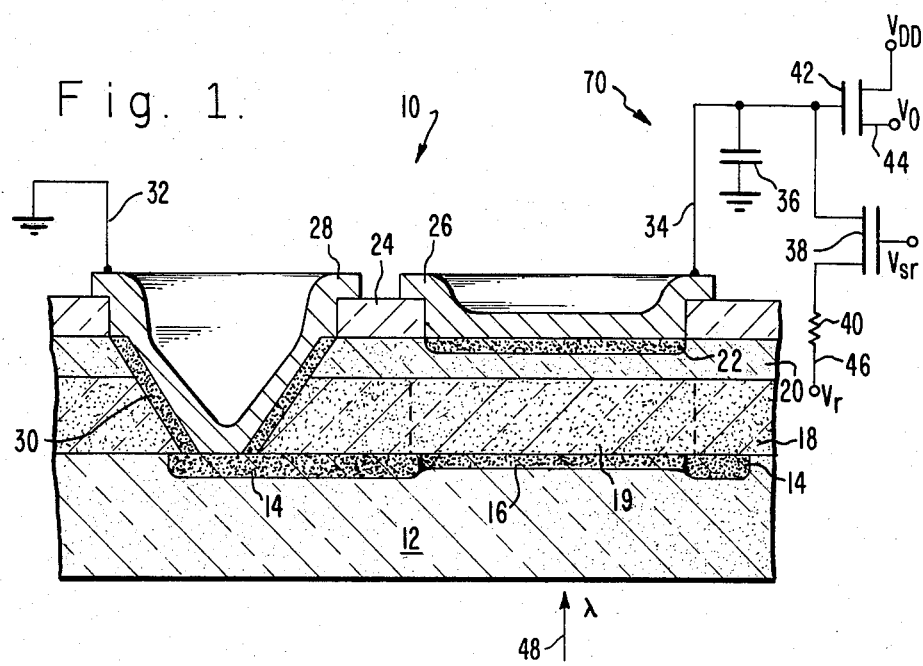
FIG. 1 is a cross-sectional view of a backside illuminated radiation detector constructed according to the preferred embodiment of the present invention.

Referring now to FIG. 1, a cross-sectional view of a backside illuminated radiation detector, generally indicated by the reference numeral 10, is shown. The radiation detector 10 is intended to operate in the backside illuminated mode and, further, to be particularly sensitive to longwave infrared (LWIR) radiation. Generally, LWIR radiation is considered to be of frequencies corresponding to a wavelength range of approximately 14 to 30 microns. Accordingly, arsenic is used as the primary detector impurity, since its ionization energy roughly corresponds to the wavelength energy of LWIR radiation.

The radiation detector 10 is substantially comprised of a detector layer 18, a blocking layer 20, and front and rear detector contacts 22, 16, respectively, that are formed on a substrate 12. Electrical contact is made to the detector 10 by way of front and rear metal contacts 26, 28. An oxide layer 24 provides electrical insulation between the metal contacts 26, 28 and portions of the underlying detector 10. A bias reset/sense access circuit 70 is associated with the detector 10. LWIR radiation, generally indicated by the arrow 48, incident on the rear surface of the detector 10 is permitted to pass through the substrate 12 and the rear detector contact 16 and into a radiation detection region 19 of the detector layer 18 wherein its presence is sensed. Accordingly, at least one aspect of the present invention is its ability to operate effectively in a backside illuminated mode.

Considering the constituent components in greater detail, the radiation detector 10 is fabricated on a substrate 12 that is substantially transparent to LWIR radiation. Preferably, the substrate 12 is boron doped silicon having a thickness of approximately 500 microns. Although boron impurities typically absorb some LWIR radiation, substantial transparency is retained by maintaining the impurity concentration below approximately $1 \times 10^{14}$ atoms per cubic centimeter. The orientation of the substrate crystal lattice structure should be chosen so as to permit standard anisotropic etching of epitaxial layers grown on the surface of the substrate 12. Preferably, the substrate 12 is provided with a standard <100> Miller crystal lattice orientation.

A rear detector contact 16 is formed at the front surface of the substrate 12. The rear contact 16 is optimized by considering two factors. The first is that the detector contact 16 should be heavily doped in order to have a high conductivity and, thereby, act efficiently as the rear electrical contact to the radiation detector 10. Second, the rear contact 16 should be as thin and as lightly doped a layer as possible so as to not significantly attenuate LWIR radiation as it passes through.

Therefore, the rear contact 16 should preferably be an ion implanted layer approximately 0.2 microns thick having an impurity concentration of approximately $5\times 10^{18}$ atoms per cubic centimeter. Again, arsenic is the preferred impurity in order to prevent unnecessary contamination of the radiation detector 10.

A rear detector contact grid 14 adjacent to and conductively connected with the rear contact 16, is also formed at the front surface of the substrate 12. The rear detector grid 14 acts as a buried conductor and thus should have a conductivity as high as or higher than the rear contact 16. However, the contact grid 14 is not limited as to either its doping density or thickness, since it is not required to transmit LWIR radiation. Preferably then, the grid 14 is an ion implanted layer approximately 0.4 microns thick having an arsenic impurity concentration of approximately $2\times 10^9$ atoms per cubic centimeter. The doping concentration of the detector contact grid 14 should not, however, be so high as to hinder the eventual growth of an epitaxial layer thereon. Naturally, the front surface of the substrate 12 can be annealed following the formation of the detector contact 16 and detector grid 14 so as to reduce surface defects that might otherwise inhibit uniform epitaxial layer growth.

A detector layer 18 is formed on the front surface of the substrate 12 so as to overlie the detector grid 14 and contact 16. The portion of the detector layer 18 overlying the rear detector contact 16 substantially forms the radiation detection region 19 of the radiation detector 10. The doping density and the thickness of the detection region 19, as interdependent factors, should be optimized so as to achieve a maximum radiation absorbtion efficiency (preferably above 85%). An additional factor that must be considered is that the thickness of the detection region 19 is directly proportional to the ultimate sensitivity of the radiation detector 10 to gamma frequency radiation. This sensitivity is the direct result of an increased statistical chance that gamma radiation will ionize an impurity electron in a thick detection region as compared to a thinner, but heavier doped, detection region 19. Typically, gamma radiation sensitivity is disadvantageous since it causes spurious operation of the detector 10. Considering these factors, the detector layer 18 is preferably a thin arsenic doped, epitaxially grown layer approximately 7 microns thick (generally within an approximate range of 5 to 10 microns thick) having an impurity concentration of approximately $1\times 10^{18}$ atoms per cubic centimeter so that the corresponding radiation absorption efficiency is approximately 90% or greater.

The blocking layer 20 is formed preferably as an epitaxial layer on the front surface of the detector layer 18. It is thereby interposed between the front detector contact 22 and the detector layer 18. As another aspect of the present invention, the blocking layer 20 is provided within the radiation detector 10 structure to substantially inhibit the operation of a dark current mechanism generally known as impurity band conduction. Briefly, this mechanism involves the effective conduction of impurity band holes through the impurity band of the crystal lattice to the negative potential contact in response to the applied electric field. Since this conduction is completely within the impurity band, an equal number of holes must be injected from the positive voltage potential detector contact 22 in order for current to flow. The injection of holes, however, can be substantially inhibited by interposing the blocking layer 20 between the positive potential contact and the detector layer 18, provided that the impurity concentration within the blocking layer 20 is substantially below that of the detector layer 18. This effectively interrupts the conduction path of the impurity band conduction mechanism and, thereby, results in a direct reduction in dark current. Accordingly, the blocking layer 20 preferably has an impurity concentration of less than or equal to $1\times 10^{15}$ atoms per cubic centimeter. Arsenic is the preferred impurity simply to prevent the unnessary contamination of the detector layer 18 with a different impurity. The thickness of the blocking layer 20 need be sufficient only to prevent a direct electrical contact between the front detector contact and the detector layer 18. A preferable blocking layer thickness is 3 microns.

The front detector contact 22 is formed as a thin, highly conductive layer adjacent to the front surface of the blocking layer 20. Accordingly, the detector front contact 22 is preferably created by low energy ion implantation so as to have an impurity concentration of approximately $1\times 10^{20}$ atoms per cubic centimeter. Again, arsenic is the preferred impurity type so as to reduce to the possiblity of contaminating the detector layer 18.

The oxide layer 24, preferably having a thickness of approximately 1,000 Å, is formed over the entire front surface of the blocking layer 20. This is to provide a basis for the selective processing necessary to form the radiation detector front and rear metal contacts 26, 28, respectively. Specifically, it allows a particularly positioned window to be opened above a portion of the rear detector contact grid 14. A standard anisotropic etch can then be performed so as to expose a smaller portion of the grid 14. A window is also opened above the front detector contact 22. Since the front contact 22 is immediately exposed thereby, no additional etching is required. The electrically separate front and rear metal contacts 26, 28 can be sputter deposited from the front of the radiation detector 10 so as to be in electrical contact with the front detector contact 22 and the rear detector contact grid 14, respectively. In order to further simplify the fabrication of the radiation detector 10, the oxide layer 24 may be also used as a mask during the ion implantation of the front detector contact 22. That is, the oxide layer 24 may be formed and portions of the blocking layer 20 and the rear detector grid 14 exposed prior to the formation of the front detector contact 22 by ion implantation. The oxide layer 24 naturally allows implanted layers to be formed only at the exposed surfaces of the detector and blocking layer 18, 20. Thus, a V-groove contact layer 30 is formed in addition to the front contact 22. The V-groove contact layer 30 is purely optional within the structure of the radiation detector 10 and is substantially nonfunctional due to its distance of several times the thickness of the detector layer 18 (typically 15 times) from the radiation detection region 19.

To operate the radiation detector 10, an electric field is applied across the detector 10 by placing a positive voltage potential on the front detector contact 22 relative to the rear detector contact 16. This is accomplished by the bias reset/sense access circuit 70. This circuit 70 is typically part of the read-out circuit provided in conjunction with each radiation detector 10. Although the specific design of bias reset/sense access circuits may vary significantly, they must provide essentially the same functions. For simplicity, the bias reset/sense access circuit used in conjunction with the preferred embodiment of the present invention will be described.

The bias reset/sense access circuit 70 includes a common lead 32 that connects the rear metal contact 28 to a ground reference voltage potential and a detector output lead 34 that is interconnected between the front metal contact 26 and a bias capacitor 36, a bias reset FET 38, and a detector sense access FET 42. The voltage potential difference is placed across the radiation detector 10 by providing the bias reset FET 38 with a conduction enabling detector bias reset signal, $V_{sr}$. This permits current from a reference voltage potential, $V_r$, present on the bias input lead 46 and limited by a small inherent impedance, represented by a resistor 40, to charge the bias capacitor 36 to the desired radiation detector bias voltage potential. This bias potential must be sufficient to create a depletion region across substantially the entire radiation detection region of the detector layer 18. Typically, a bias voltage potential of between 200 to 300 mv has been found sufficient for use in conjunction with the preferred embodiment of the present invention. It should be understood that the maximum bias voltage potential is limited by the thickness of the detector layer 18 used in any particular radiation detector 10. The limiting factor is that if the depletion region induced by the bias voltage potential extends into the front and rear detector contacts 22, 16, a punch-through breakdown of the radiation detector 10 will result. Thus, the depletion region should substantially, but not completely, extend over the thickness of the radiation detection region 19 of the detector layer 18.

Once the bias capacitor 36 has been charged to its bias voltage potential, the bias reset signal, $V_{sr}$, is removed and the potential difference appearing across the radiation detector 10 is allowed to vary in proportion to the amount of LWIR radiation 48 incident on the detector 10. That is, LWIR radiation 48 is transmitted through the substrate 12 and the rear detector contact 16 and into the radiation detection region of the detector layer 18. The radiation 48 is substantially absorbed by the arsenic impurity atoms resulting in the ionization of electrons into the conduction band of the crystal lattice. The impurity band holes created within the depleted portion of the radiation detection region 19 are swept towards the negative potential rear contact 16 under the influence of the applied electric field. The resulting current ultimately causes a reduction of the voltage potential appearing across the bias capacitor 36. Naturally, the reduction in voltage potential is proportional to the number of impurity band holes generated which is, in turn, dependent on the intensity of the LWIR radiation 48 incident on the radiation detector 10. The reduced voltage potential across the capacitor 36 is buffered onto the sense output lead 44 by the sense voltage output FET 42. The FET 42 acts as a buffer by being connected as a source follower. That is, the gate of the FET 42 is connected to the detector output lead 34 while its drain is connected to a positive voltage potential, $V_{DD}$, greater than or equal to the bias reference potential $V_r$. Thus, the voltage potential present on the sense output lead 44, the source of the FET 42, will be a close approximation of the voltage potential present on the gate of the FET 42. The voltage present on the sense output lead 44 can therefore be used to effectively sense the voltage potential appearing across the radiation detector 10.

Figure 2:
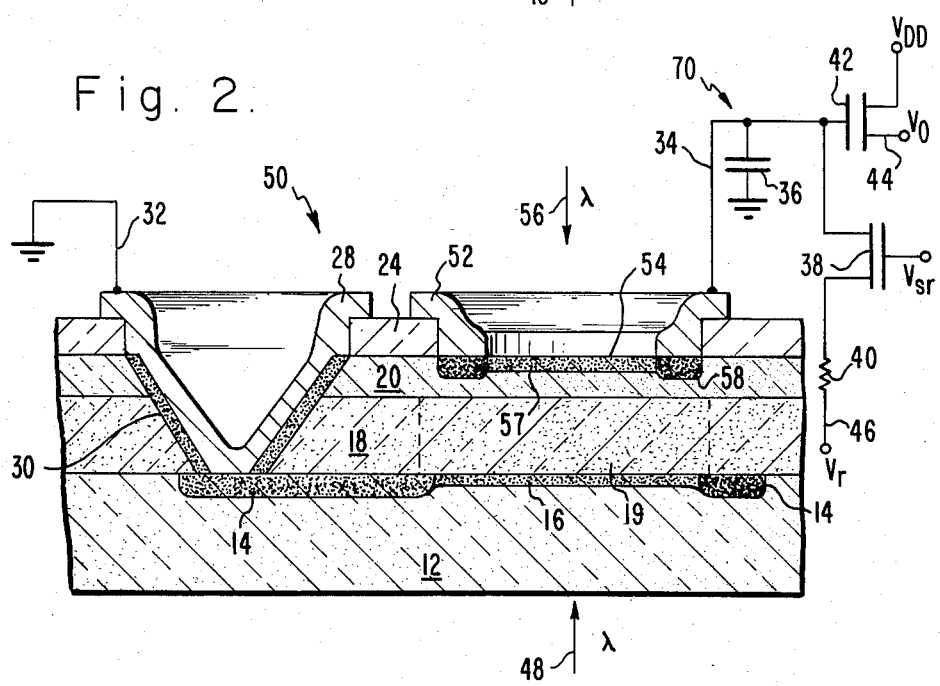
FIG. 2 is a cross-sectional view of a frontside and backside illuminated radiation detector constructed according to an alternate embodiment of the present invention.

Referring now to FIG. 2, a cross-sectional view of a combination frontside and backside illuminated radiation detector, generally indicated by the reference numeral 50, is shown. The radiation detector 50 is an alternate embodiment of the present invention differing slightly, though significantly, from the radiation detector 10 of FIG. 1. In order to enable radiation to penetrate from the front side of the radiation detector 50 into the radiation detection region of the detector layer 18, an alternate front detector/metal contact structure is employed. In particular, the front detector contact 57 is formed as a thin, highly conductive layer adjacent to the front surface of the blocking layer 20. The front detector contact 57 must be substantially transparent to frontside incident LWIR radiation 56. Accordingly, the impurity concentration and thickness of the front detector contact 57 should be substantially similar to those of the rear detector contact 16. A front detector contact grid 58 is also formed at the front surface of the blocking layer 20 adjacent to and conductively connected with the front detector contact 57. Similar to the rear detector grid 14, the front detector grid 58 functions as a conductive connection between the front detector contact 57 and the front metal contact 52. Thus, the impurity concentration and thickness of the front detector grid 58 should be substantially identical to those of the rear detector grid 14. The front metal contact 52 is provided to form an electrical conduction path between the radiation detector 50 and the bias reset/sense access circuit 70. It is formed, however, so as to substantially overlap only the front detector grid 58, thereby leaving exposed the front surface of the front detector contact 57. The resulting front detector window 54 permits radiation 56, incident on the frontside of the detector 50, to penetrate through the front detector contact 57 and the blocking layer 20 and into the radiation detection region 19 of the detector layer 18. Accordingly, the ability to operate in either a frontside or a backside illuminated mode, or both, is another aspect of the present invention.

It should be clear that either the impurity concentration or the thickness, or both, of the detector layer 18 must be increased in order for the radiation detector 50 to maintain an acceptable radiation absorption efficiency. In the radiation detector 10 of FIG. 1, the front metal contact 26 acts as a reflector for radiation 48 that initially passes through the radiation detection region of the detector layer 18 without being absorbed. This radiation 48 is reflected back through the detector layer 18 so that there is a second opportunity for it to be absorbed. Consequently, the radiation detector 10 of FIG. 1 enjoys a inherently high radiation absorption efficiency. However, in the radiation detector 50 of FIG. 2, the front metal contact 52 can not function significantly as a radiation reflector. Thus, the radiation detector 50 has only a single opportunity to absorb either the backside incident radiation 48 or the frontside incident radiation 56 as it passes through the radiation detection region of the detector layer 18. Naturally, the value of the bias voltage potential placed across the bias capacitor 36 must reflect any change in the thickness of the detector layer 18.

Figure 3:
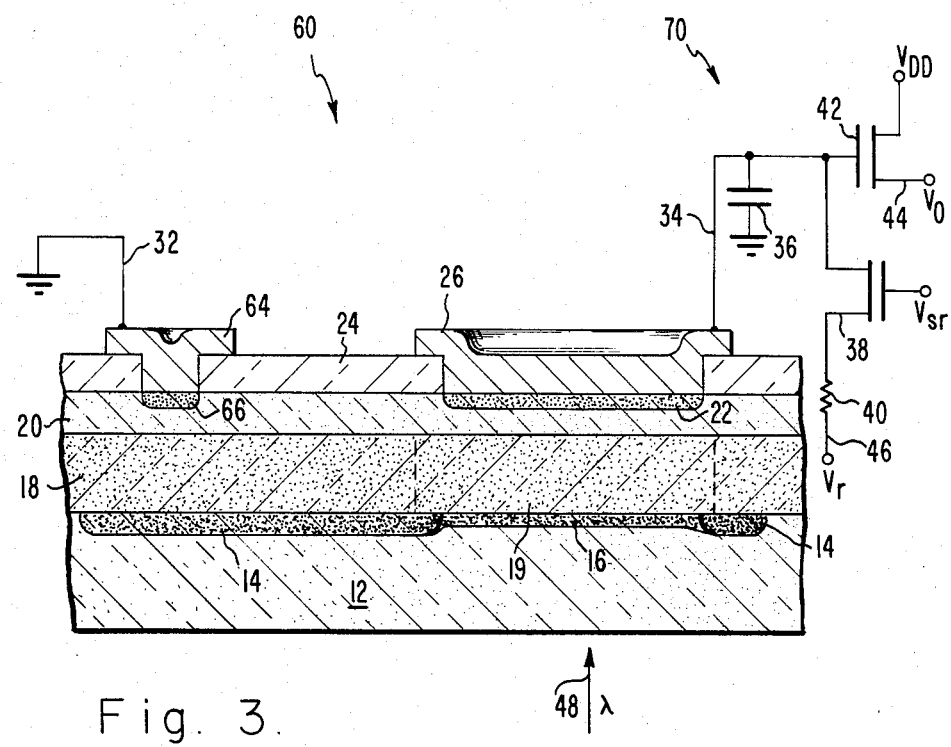
FIG. 3 is a cross-sectional view of a backside illuminated radiation detector utilizing an alternate rear contact electrical connection structure constructed according to an alternate embodiment of the present invention.

Referring now to FIG. 3, a cross-sectional view of a backside illuminated radiation detector, generally indicated by the reference numeral 60, having a simplified rear metal contact structure is shown. The modified radiation detector 60 is substantially identical to the radiation detector 10 of FIG. 1. It differs, however, in that the rear metal contact structure has been modified to simplify the fabrication of the detector 60. In particular, the procedure is simplified by the complete omission of the etching of the V-groove. Instead, a window is opened in the oxide layer 24 over a portion of the rear detector contact grid 14. A highly conductive rear contact layer 66 is formed at the exposed surface of the blocking layer 20. The contact layer 66 should have an impurity concentration and thickness substantially similar to those of the front detector contact 22. To further simplify the fabrication of the detector 60, the rear contact layer 66 may be formed concurrently with the front detector contact 22 followed by the concurrent formation of the rear metal contact 64 with the front metal contact 26.

Conduction between the rear detector contact grid 14 and the rear contact layer 66 results from the fact that the grid 14 is inherently at a voltage potential above that of the contact layer 66. Consequently, the transition region formed at the junction of the detector layer 18 and the blocking layer 20, in the vicinity of the contact layer 66, is significantly narrowed, thereby permitting current conduction. Naturally, the distance between the front detector contact 22 and the rear contact layer 66 should be substantially greater (typically 15 times greater) than the thickness of the blocking layer 20 in order to prevent undesirable current conduction between the front contact 22 and the rear contact layer 66.

Figure 4:
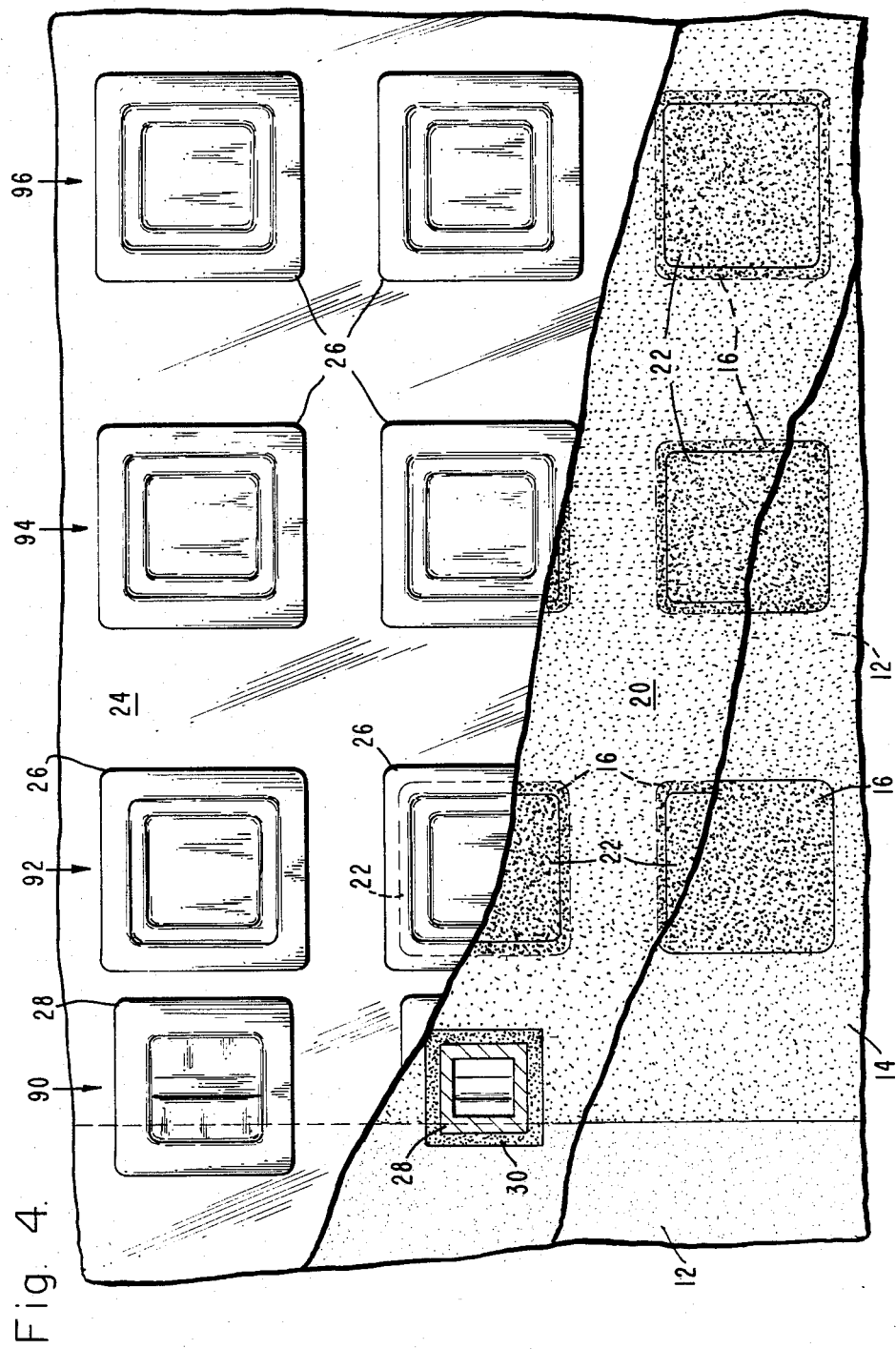
FIG. 4 is a partial top view of a monolithic substrate radiation detector focal plane array utilizing radiation detectors of the type shown in FIG. 1 and adaptable for use with a hybrid read-out structure.

Referring now to FIG. 4, a portion of a monolithic substrate focal plane array (FPA) is shown. The complete FPA includes a number of radiation detectors disposed in a regular matrix array. Although any one of the above described embodiments of the present invention can be utilized in an FPA, for simplicity the preferred backside illuminated radiation detector embodiment (FIG. 1) of the present invention will be described in conjunction with the FPA shown in FIG. 4. The radiation detectors 10 utilize a common rear detector contact grid 14 to provide common electrical connection to a number of rear metal contacts 28 boardering the detector array. In particular, FIG. 4 shows a portion of three columns 92, 94, 96 of the radiation detector array and a boardering column 90 of the rear metal contacts 28. The particular dimensions of the array, including the size and distance separting the radiation detection regions 19 of the detectors, other than as previously noted, are not critical. In all cases, however, the distance between the front detector contacts 22 of the detectors 10 must be sufficient for the blocking layer 20 to provide electrical isolation thereinbetween. Typically a distance of 10 microns is sufficient. In the present case, the distances must naturally be sufficient to allow mating of the front surface of the FPA to a read-out structure having a corresponding array of detector output leads 34 and common leads 32. Naturally, the reset/sense access circuits 70, associated with each front metal metal contact 26, are contained in the read-out structure. The resulting hybridized structure is thereby a integral unit containing a dense array of radiation detectors 10 intended to operate in the backside illuminated mode.

A number of other modifications and variations of the present invention can also be made to optimize the radiation detector 10 (hereinafter also generally including the alternate embodiment detectors 50, 60) for a particular application. Naturally, one such variation can be provided through the selection of the dopant used in the detector layer 18. For example, alternate dopants of indium or gallium may be used to adjust the frequency response range of the detector 10 to the infrared range of 3 to 5 microns. Gallium may also be used for the infrared range of 8 to 14 microns. Still other dopants may be used to adjust the frequency response of the radiation detector 10 to various ranges within the electromagnetic spectrum. Consequently, though the above discussion of the several embodiments of the present inventions focuses on the detection of LWIR radiation, the invention is not limited to infrared detectors but to radiation detectors in general.

Accordingly, a variation of the present invention can be achieved by utilizing a P-type impurity for both of the detector and blocking layers 18, 20, so as to provide for a P-type radiation detector. The same principles of operation apply to the radiation detector 10 constructed with P-type impurities as to the N-type radiation detectors described above.

Perhaps a more significant modification of the radiation detector 10 is the use of an impurity in the blocking layer 20 having a conductivity type opposite of that of the impurity used in the detector layer 18. Although this will inherently increase the possibility of undesirable impurity contamination of the detector layer 18, the use of an opposite conductivity type blocking layer results in an improved detector reaction time to chopped or pulsed incident radiation. That is, the amount of time required by the detector 10 to provide an output proportional to the intensity of the radiation incident thereon, when the incident radiation is being chopped at a non-negligible duty cycle, is significantly reduced. It is believed that this improved response time is due to the elimination of trapped electrons, inherently present in an N-type blocking layer 20, by the use of a P-type blocking layer 20 in conjunction with an N-type detector layer 18. Similarly, an improved response time is achieved through the elimination of trapped holes, inherently present in a P-type blocking layer 20, by the use of an N-type blocking layer 20 in conjunction with an N-type detector layer 18. Consequently, an aspect of the present invention is the provision of a radiation detector 10 having a significantly faster response time.

A somewhat more structural modification involves reversing the order of the detector layer 18 and the blocking layer 20, with respect to the substrate 12. This modification permits the radiation detector 10 to be operated from a negative reference voltage potential relative to the ground reference voltage potential applied to the rear metal contact 28. However, this modification results in the loss of the inherent electrical isolation between the front detector contacts 22 of adjacent radiation detectors 10 formed on a common substrate 12. Since the blocking layer 20 has a fairly low impurity concentration, the resistivity of the layer 20 is correspondingly high. Thus, by forming the front detector contacts 22 in the blocking layer 20, substantial electrical isolation is gained by virtue of the high resistivity of the layer and the distance between the front detector contacts 22 of adjacent radiation detectors 10. Formation of the front detector contacts 22 in the detector layer 18, as implied by the presently suggested modification, would result in the substantial loss of electrical isolation due to the significantly lower resistivity of the detector layer 18.

Finally, the radiation detector 10 can be modified through the use of any one of several different materials for the substrate 12. These materials may include a semiconductor crystal, as contemplated by the preferred embodiment of the present invention, though doped with any N- or P-type impurity, or a nonsemiconductor material, such as glass or sapphire. The use of any one of these alternate materials may be for the purpose of increasing the transparency of the substrate to a desired radiation frequency range or to afford the radiation detector 10 with a greater mechanical strength.

Thus, a radiation detector having an enhanced sensitivity to incident radiation and that can be easily adapted to a wide variety of applications has been disclosed. Obviously, many modifications and variations of the present invention are possible in light of the above description of the preferred and alternate embodiments. In addition to those modifications listed above, other modifications may include the introduction of impurities into the detector structure by diffusion and the use of conductively doped polysilicon in place of the metal conductors. It should also be clear that, the various processing steps required to fabricate the various embodiments of the detector, all of which are conventional in nature, have not been described in order to not obscure the nature of the present invention. It is therefore to be understood that, within the scope of the appended claims, the present invention may be practiced otherwise than as specifically described.

What is claimed is:

1. A radiation detector comprising:
   (a) a first semiconductor layer of a given thickness and impurity concentration appropriate for absorbing radiation in a given frequency range whereupon a proportional number of signal representing charge carriers are generated;
   (b) a second semiconductor layer of a given thickness and impurity concentration adjacent said first layer;
   (c) first and second contacts adjacent said first and second layers, respectively, and conductively coupled therethrough, the impurity concentration of said second layer being less than that of said first layer, said second layer being sufficiently thick and having a sufficiently low impurity concentration to substantially prevent the injection of charge carriers from said second contact into said first layer at the energy level of the impurity conduction band of said first layer; and
   (d) a substrate transparent to radiation within said given frequency range and adjacent a particular one of said first and second contacts, said particular one of said contacts being sufficiently thin to allow substantially all of the radiation within said given frequency range incident thereon to pass therethrough.

2. The radiation detector of claim 1 further comprising a metal contact substantially reflective with regard to radiation within said given frequency range, said metal contact provided adjacent one of said first and second contacts opposite said substrate so that radiation incident on said substrate passes into and, in part, through said first layer and then is reflected back, to the extent that it has not been absorbed, into said first layer.

3. The radiation detection of claim 2 wherein said given frequency range corresponds to long wave infrared radiation having wavelengths between approximately 14 to 30 microns.

* * * * *

Dedication 4,507,674.—*Stephen D. Gaalema*, Carlsbad, Calif. BACKSIDE ILLUMINATED BLOCKED IMPURITY BAND INFRARED DETECTOR. Patent dated Mar. 26, 1985. Dedication filed Dec. 23, 1985, by the assignee, *Hughes Aircraft Co.*

Hereby dedicates to the public the entire term of said patent.
[*Official Gazette April 8, 1986.*]